United States Patent
Nevou et al.

(10) Patent No.: US 11,402,202 B2
(45) Date of Patent: Aug. 2, 2022

(54) PROXIMITY SENSORS AND METHODS FOR OPERATING THE SAME

(71) Applicant: ams Sensors Singapore Pte. Ltd., Singapore (SG)

(72) Inventors: Laurent Nevou, Zürich (CH); Jens Geiger, Thalwil (CH); James Eilertsen, Zurich (CH)

(73) Assignee: AMS SENSORS SINGAPORE PTE. LTD., Singapore (SG)

( * ) Notice: Subject to any disclaimer, the term of this patent is extended or adjusted under 35 U.S.C. 154(b) by 330 days.

(21) Appl. No.: 16/622,792

(22) PCT Filed: Jun. 14, 2018

(86) PCT No.: PCT/US2018/037514
§ 371 (c)(1),
(2) Date: Dec. 13, 2019

(87) PCT Pub. No.: WO2018/232105
PCT Pub. Date: Dec. 20, 2018

(65) Prior Publication Data
US 2020/0149884 A1 May 14, 2020

Related U.S. Application Data

(60) Provisional application No. 62/520,029, filed on Jun. 15, 2017.

(51) Int. Cl.
*G01C 3/02* (2006.01)
*G01S 17/10* (2020.01)
(Continued)

(52) U.S. Cl.
CPC ................ *G01C 3/02* (2013.01); *G01S 17/10* (2013.01); *G06F 3/0421* (2013.01); *H03K 17/9631* (2013.01)

(58) Field of Classification Search
CPC ........ G02B 27/16; G02B 27/20; G02B 27/32; G02B 3/0068; G02B 3/12; G02B 6/0036;
(Continued)

(56) References Cited

U.S. PATENT DOCUMENTS 8,643,628 B1 * 2/2014 Eriksson ............... G06F 3/0421
345/173
2010/0245289 A1 9/2010 Svajda
(Continued)

FOREIGN PATENT DOCUMENTS

TW 200830596 A 7/2008
TW 201309093 A 2/2013
WO WO-2014208087 A1 * 12/2014 ........... G01B 11/026

OTHER PUBLICATIONS

Yong Sin Kim et al., "A motion gesture sensor using photodiodes with limited field-of-view", Optics Express, vol. 21, No. 8, Apr. 2013; pp. 9206-9214.
(Continued)

*Primary Examiner* — Michael P Stafira
(74) *Attorney, Agent, or Firm* — Kilpatrick Townsend & Stockton LLP

(57) ABSTRACT

An optoelectronic device has an asymmetric field overlap and is operable to measure proximity independently of object surface reflectivity. In some instances, the optoelectronic device includes a plurality of light-emitting assemblies and a light-sensitive assembly. In some instances, the optoelectronic devices include a plurality of light-sensitive assemblies and a light-emitting assembly. An asymmetric field overlap is attained in various implementations via various field-of-view axis, field-of-view angle, field-of-illumination axis, field-of-illumination angle, optical element and/or pitch configurations.

20 Claims, 9 Drawing Sheets

(51) Int. Cl.
   *G06F 3/042* (2006.01)
   *H03K 17/96* (2006.01)
(58) Field of Classification Search
   CPC .............. G01C 21/32; G01C 21/3602; G01C
   21/3841; G01C 21/1652; G01C 21/28;
   G01C 21/3461; G01C 21/3623; G01C
   21/3691; G01C 21/3807; G01C 21/3815;
   G01C 21/3833; G01C 21/3859; G01C
   21/1656; G01C 21/26; G01C 21/3811;
   G01C 21/3848; G01C 21/206; G01C
   15/002; G01C 3/08; G01C 21/20; G01C
   17/28; G01C 21/30; G01C 21/3647;
   G01C 11/02; G01C 17/38; G01C 3/02;
   G01C 21/00; G01C 25/005; G01C 3/06;
   G01C 1/04; G01C 21/165; G01C
   21/3407; G01C 21/3469; G01C 21/3484;
   G01C 21/3492; G01C 21/36; G01C
   21/3629; G01C 21/3652; G01C 21/3661;
   G01C 21/3682; G01C 21/3697; G01C
   3/085; G01C 13/08; G01C 1/20; G01N
   15/06; G01N 15/0656; G01N 2015/0693;
   G01N 2021/651; G01N 21/31; G01N
   21/53; G01N 21/532; G01N 21/65; G01N
   2223/05; G01N 2223/076; G01N
   2223/6116; G01N 23/201; G01N 23/207;
   G01N 23/223; G01J 1/0411; G01J
   1/0422; G01J 1/4228; G01J 3/02; G01J
   3/0218; G01J 3/0229; G01J 3/26; G01J
   3/28; G01J 3/2803; G01J 3/42; G01J
   3/51; G01J 2005/0077; G01J 2005/0085;
   G01J 2005/068; G01J 5/0025; G01J
   5/0265; H03K 17/962; H03K
   2217/94108; H03K 17/04123; H03K
   17/941; H03K 17/9631; H03K 17/969;
   H03K 2217/96003; H03K 2217/96079;
   H03K 17/943; H03K 17/9622; H03K
   2217/96042; H03K 2217/960755; H03K
   2217/960785; H03K 17/9535; H03K
   17/955; H03K 17/9627; H03K 17/9638
   See application file for complete search history.

(56) References Cited

U.S. PATENT DOCUMENTS

| | | | |
|---|---|---|---|
| 2012/0200861 A1* | 8/2012 | Chen | G01B 11/002 356/614 |
| 2013/0321345 A1* | 12/2013 | Burns | G09G 3/3466 345/175 |
| 2014/0088761 A1 | 3/2014 | Shamlian et al. | |
| 2015/0169133 A1 | 6/2015 | Eriksson et al. | |
| 2015/0226553 A1 | 8/2015 | Fuchikami et al. | |

OTHER PUBLICATIONS

PCT/US2018/037514 International Search Report and Written Opinion, dated Nov. 6, 2018.
European Patent Application No. 18817554.1, "Extended European Search Report", dated Feb. 19, 2021, 10 pages.
Office Action with Search Report for Taiwanese Patent Application No. 107120866, dated Jan. 12, 2022, 20 pages.

* cited by examiner

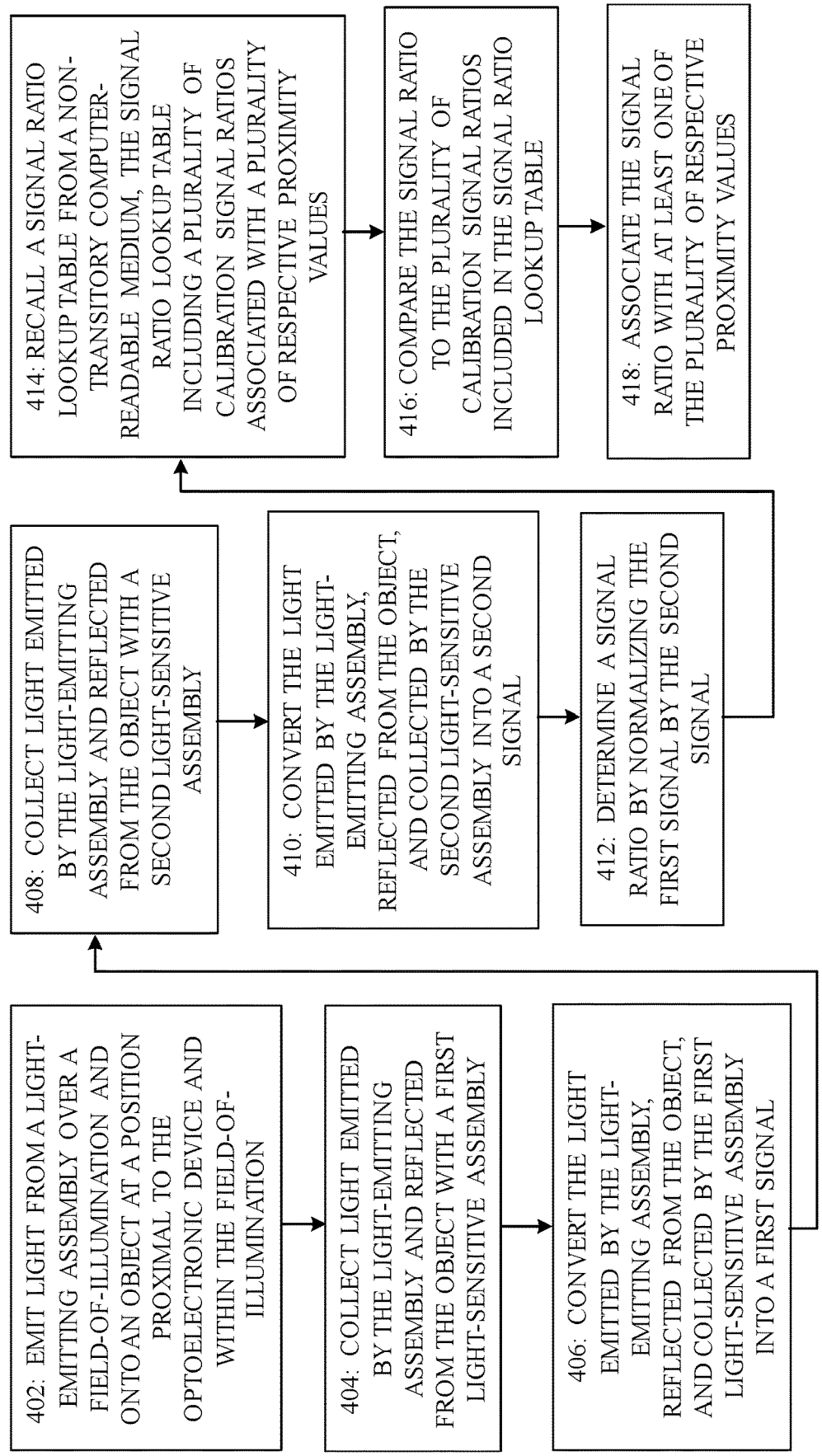

PROXIMITY SENSORS AND METHODS FOR OPERATING THE SAME

CROSS-REFERENCE TO RELATED APPLICATIONS

This application is a 371 U.S. National Phase of PCT International Patent Application No. PCT/US2018/037514, filed on Jun. 14, 2018, which claims benefit and priority to U.S. provisional patent application No. 62/520,029, filed on Jun. 15, 2017, the disclosures of which are each incorporated by reference herein in their entirety.

BACKGROUND

Optoelectronic proximity sensors typically are configured to measure the distances of objects (e.g., a finger, hand, or ear) in close proximity. Optoelectronic proximity sensors operate by directing light onto an object, and collecting the light reflected from the object. Often the intensity of the collected light is related (e.g., proportional) to the distance between the object and the optoelectronic proximity sensor. However, objects exhibit a range of surface reflectivity. For example, in instances where the object is a finger, hand or ear, the surface reflectivity of the object can depend strongly on skin pigmentation. Accordingly, optoelectronic proximity sensors operable to measure proximity independent of object surface reflectivity are needed.

SUMMARY

This disclosure describes optoelectronic devices operable to measure proximity substantially independently of object surface reflectivity and methods for operating the same. The optoelectronic devices described in this disclosure have an asymmetric field overlap. The asymmetric field overlap permits proximity measurements substantially independent of object surface reflectivity.

In one aspect, for example, an optoelectronic device operable to measure proximity includes a first light-emitting assembly, a second light-emitting assembly, and a light-sensitive assembly. The first light-emitting assembly is operable to emit light onto an object at a position proximal to the optoelectronic device within a first field-of-illumination. The first field-of-illumination is characterized by a first field-of-illumination angle and first field-of-illumination axis. The second light-emitting assembly being operable to emit light onto the object at the position proximal to the optoelectronic device and within a second field-of-illumination. The second field-of-illumination is characterized by a second field-of-illumination angle and a second filed-of-illumination axis.

The light-sensitive assembly is operable to collect light over a field-of-view. The field-of-view is characterized by a field-of-view angle and field-of-view axis. The light-sensitive assembly is operable to convert light emitted by the first light-emitting assembly reflected from the object into a first signal. Moreover, the light-sensitive assembly is operable to convert light emitted by the second light-emitting assembly reflected from the object into a second signal. The light-sensitive assembly is disposed from the first light-emitting assembly by a first pitch, and the light-sensitive assembly is disposed from the second light-emitting assembly by a second pitch.

In some instances, the first light-emitting assembly, the second light-emitting assembly, and/or the light-sensitive assembly includes an optical assembly. The optical assembly can include an anti-reflection coating.

In some instances, the first light-emitting assembly and the second light-emitting assembly includes a light-emitting component. The light-emitting component can include a light-emitting diode and/or a laser diode.

In some instances, the light-sensitive assembly includes a light-sensitive component. The light-sensitive component can include a photodiode, charge-coupled device, and/or a complementary metal-oxide-semiconductor.

In some instances, the first pitch is substantially unequal to the second pitch, and the first field-of-illumination angle is substantially unequal to the second field-of-illumination angle. For example, the second pitch is between two and ten times the length of the first pitch, and the first field-of-illumination angle is between two and ten times the angle of the second field-of-illumination angle.

In some instances, the asymmetric field overlap is attained by a configuration including up to all but one of the following:
  the first pitch is substantially equal to the second pitch
  the first field-of-illumination angle is substantially equal to the second illumination angle
  the first field-of-illumination axis is substantially parallel to the second field-of-illumination axis
  the field-of-view angle is substantially equal to the first field-of-illumination angle
  the field-of-view angle is substantially equal to the second field-of-illumination angle
  the field-of-view axis is substantially parallel to the first field-of-illumination axis
  the field-of-view axis is substantially parallel to the second field-of-illumination axis.

In some implementations, the first pitch is unequal to the second pitch. In some cases, the optoelectronic device includes an optical element over only one of the first light-sensitive assembly or the second light-sensitive assembly, wherein the presence of the optical element contributes to the asymmetric field overlap. In some instances, the optoelectronic device includes a respective optical element over each of the first light-sensitive assembly and the second light-sensitive assembly, wherein a difference in the optical element over the first light-sensitive assembly and the optical element over the second light-sensitive assembly contributes to the asymmetric field overlap.

In some instances, two or more approaches described here for attaining an asymmetric overlap can be used in combination.

In some instances, the optoelectronic device includes a processor and a non-transitory computer-readable medium comprising instructions stored thereon, that when executed on the processor, perform operations including:
  emitting light from the first light-emitting assembly over the first field-of-illumination and onto the object at the position proximal to the optoelectronic device and within the first field-of-illumination
  collecting light emitted by the first light-emitting assembly and reflected from the object with the light-sensitive assembly
  converting the light emitted by the first light-emitting assembly, reflected from the object, and collected by the light-sensitive assembly into the first signal
  emitting light from the second light-emitting assembly over the second field-of-illumination and onto the object at the position proximal to the optoelectronic device and within the second field-of-illumination collecting light emitted by the second light-emitting assembly and reflected from the object with the light-sensitive assembly converting the light emitted by the second light-emitting assembly, reflected from the object, and collected by the light-sensitive assembly into the second signal determining a signal ratio by normalizing the first signal by the second signal recalling a threshold signal ratio from the non-transitory computer-readable medium, the threshold signal ratio being associated with a threshold proximity value relative to the optoelectronic device comparing the threshold signal ratio to the signal ratio associating the threshold proximity value with the position of the object proximal to the optoelectronic device for signal ratios equal to or greater than the threshold signal ratio.

In another aspect, for example, a method for operating the optoelectronic device includes:

emitting light from a first light-emitting assembly over a first field-of-illumination and onto an object at a position proximal to the optoelectronic device and within the first field-of-illumination collecting light emitted by the first light-emitting assembly and reflected from the object with a light-sensitive assembly converting the light emitted by the first light-emitting assembly, reflected from the object, and collected by the light-sensitive assembly into a first signal emitting light from a second light-emitting assembly over a second field-of-illumination and onto the object at the position proximal to the optoelectronic device and within a second field-of-illumination collecting light emitted by the second light-emitting assembly and reflected from the object with the light-sensitive assembly converting the light emitted by the second light-emitting assembly, reflected from the object, and collected by the light-sensitive assembly into a second signal determining a signal ratio by normalizing the first signal by the second signal recalling a threshold signal ratio from a non-transitory computer-readable medium, the threshold signal ratio being associated with a threshold proximity value relative to the optoelectronic device comparing the threshold signal ratio to the signal ratio associating the threshold proximity value with the position of the object proximal to the optoelectronic device for signal ratios equal to or greater than the threshold signal ratio.

In another aspect, for example, an optoelectronic device operable to measure proximity includes a light-emitting assembly, a first light-sensitive assembly, and a second light-sensitive assembly. The light-emitting assembly is operable to emit light onto an object at a position proximal to the optoelectronic device within a field-of-illumination. The field-of-illumination is characterized by a field-of-illumination angle and an illumination axis.

The first light-sensitive assembly is operable to collect light over a first field-of-view. The first field-of-view is characterized by a first field-of-view angle and first view axis. The first light-sensitive assembly is operable to convert light emitted by the light-emitting assembly reflected from the object into a first signal.

The second light-sensitive assembly is operable to collect light over a second field-of-view. The second field-of-view is characterized by a second field-of-view angle and second view axis. The second light-sensitive assembly is operable to convert light emitted by the light-emitting assembly reflected from the object into a second signal. Moreover, the first light-sensitive assembly is disposed from the light-emitting assembly by a first pitch, and the second light-sensitive assembly is disposed from the light-emitting assembly by a second pitch.

In some instances, the light-emitting assembly, the first light-sensitive assembly, and/or the second light-sensitive assembly includes an optical assembly. The optical assembly can include an anti-reflection coating.

In some instances, the light-emitting assembly includes a light-emitting component. The light-emitting component can include a light-emitting diode and/or a laser diode.

In some instances, the first light-sensitive assembly and the second light-sensitive assembly each include a light-sensitive component. The light-sensitive component can include a photodiode, a charge-coupled device, and/or a complementary metal-oxide-semiconductor.

In some instances, the first pitch is substantially unequal to the second pitch, and the first field-of-view angle is substantially unequal to the second field-of-view angle. For example, the second pitch is between two and ten times the length of the first pitch, and the first field-of-view angle is between two and ten times the angle of the second field-of-view angle.

In some instances, the asymmetric field overlap is attained by any configuration including up to all but one of the following:

the first pitch is substantially equal to the second pitch the first field-of-view angle is substantially equal to the second field-of-view angle the first field-of-view axis is substantially parallel to the second field-of-view axis the field-of-illumination angle is substantially equal to the first field-of-view angle the field-of-illumination angle is substantially equal to the second field-of-view angle the field-of-illumination axis is substantially parallel to the first field-of-view axis the field-of-illumination axis is substantially parallel to the second field-of-view axis.

In some instances, the optoelectronic device can include a processor, and can include a non-transitory computer-readable medium comprising instructions stored thereon, that when executed on the processor, perform operations including:

emitting light from the light-emitting assembly over the field-of-illumination and onto the object at the position proximal to the optoelectronic device and within the field-of-illumination collecting light emitted by the light-emitting assembly and reflected from the object with the first light-sensitive assembly converting the light emitted by the light-emitting assembly, reflected from the object, and collected by the first light-sensitive assembly into the first signal collecting light emitted by the light-emitting assembly and reflected from the object with the second light-sensitive assembly converting the light emitted by the light-emitting assembly, reflected from the object, and collected by the second light-sensitive assembly into the second signal determining a signal ratio by normalizing the first signal by the second signal recalling a threshold signal ratio from the non-transitory computer-readable medium, the threshold signal ratio being associated with a threshold proximity value relative to the optoelectronic device comparing the threshold signal ratio to the signal ratio associating the threshold proximity value with the position of the object proximal to the optoelectronic device for signal ratios equal to or greater than the threshold signal ratio.

In another aspect, for example, a method for operating the optoelectronic device includes:

emitting light from a light-emitting assembly over a field-of-illumination and onto an object at a position proximal to the optoelectronic device and within the field-of-illumination collecting light emitted by the light-emitting assembly and reflected from the object with a first light-sensitive assembly converting the light emitted by the light-emitting assembly, reflected from the object, and collected by the first light-sensitive assembly into a first signal collecting light emitted by the light-emitting assembly and reflected from the object with a second light-sensitive assembly converting the light emitted by the light-emitting assembly, reflected from the object, and collected by the second light-sensitive assembly into a second signal determining a signal ratio by normalizing the first signal by the second signal recalling a threshold signal ratio from a non-transitory computer-readable medium, the threshold signal ratio being associated with a threshold proximity value relative to the optoelectronic device comparing the threshold signal ratio to the signal ratio associating the threshold proximity value with the position of the object proximal to the optoelectronic device for signal ratios equal to or greater than the threshold signal ratio.

In some instances, the method further includes the operation of activating an auxiliary function, the auxiliary function being implemented on a host device into which the optoelectronic device is incorporated.

In some instances, the auxiliary function includes activating a display screen incorporated into the host device.

In some instances, the auxiliary function includes regulating power to a component incorporated into the host device.

In some instances, the position of the object proximal to the optoelectronic device is collected over time and stored in the non-transitory computer-readable medium as three-dimensional data.

In some instances, the three-dimensional data includes velocity and/or acceleration data of the object.

Other aspects, features and advantages will be apparent from the following detailed description, the accompanying drawings, and the claims.

BRIEF DESCRIPTION OF THE DRAWINGS

FIG. 4 depicts another example of a method for operating an optoelectronic device having an asymmetric field overlap.

DESCRIPTION

Figure 1A:
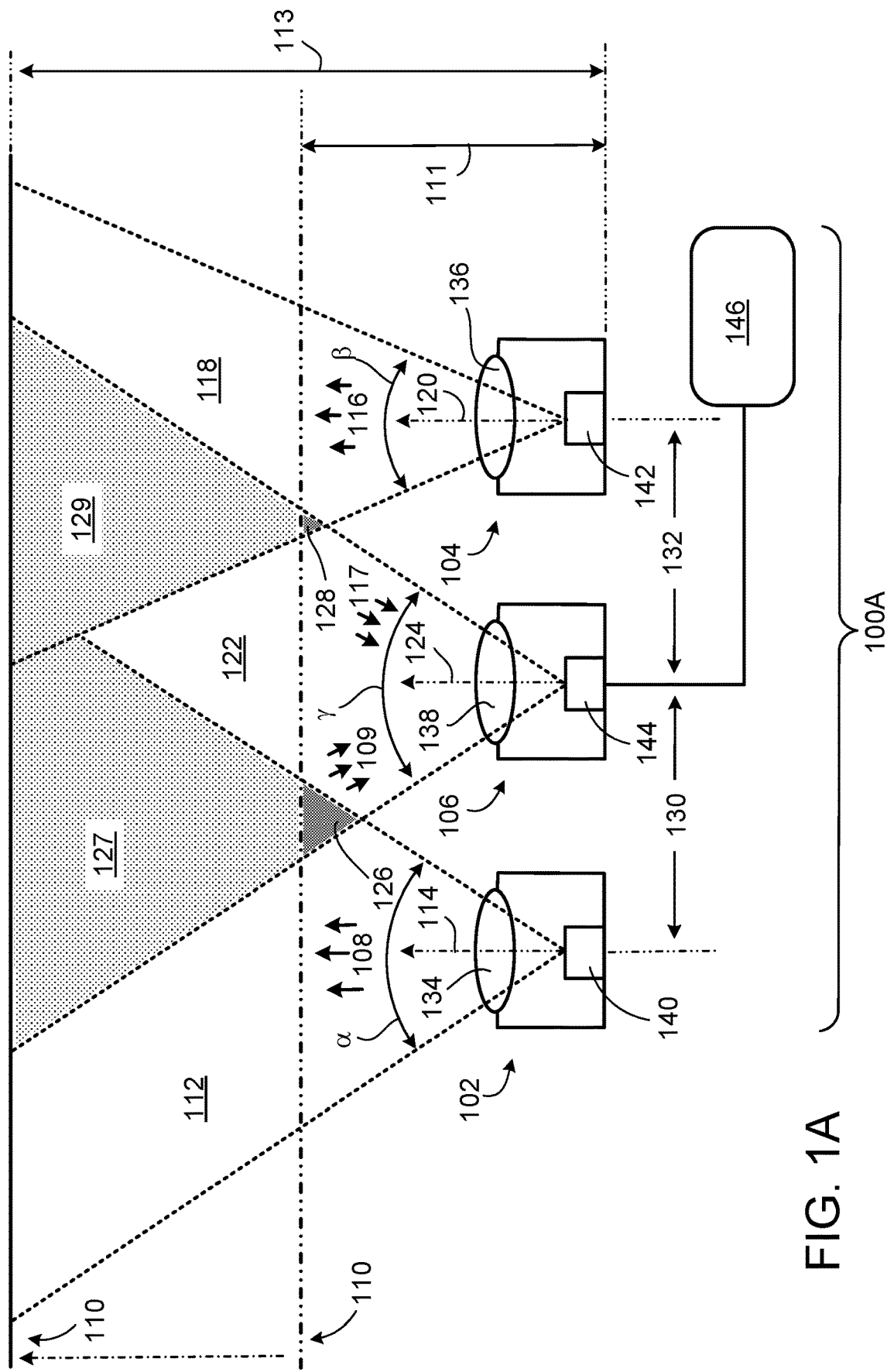
FIG. 1A depicts an example of an optoelectronic device having an asymmetric field overlap; the example device includes multiple light-emitting assemblies and a light-sensitive assembly.

FIG. 1A depicts an example optoelectronic device 100A operable to measure proximity independently of object surface reflectivity. The optoelectronic device 100A includes a first light-emitting assembly 102, a second light-emitting assembly 104, and a light-sensitive assembly 106. The first light-emitting assembly 102 is operable to emit light 108 onto an object 110 at a position proximal to the optoelectronic device 100A, such as first and second positions 111, 113, respectively, within a first field-of-illumination 112. The first field-of-illumination 112 is characterized by a first field-of-illumination angle α and first field-of-illumination axis 114.

The second light-emitting assembly 104 is operable to emit light 116 onto the object 110 at a position proximal to the optoelectronic device 100A, such as the first and second positions 111, 113, respectively, within a second field-of-illumination 118. The second field-of-illumination 118 is characterized by a second field-of-illumination angle β and a second filed-of-illumination axis 120.

The light-sensitive assembly 106 is operable to collect light over a field-of-view 122. The field-of-view 122 is characterized by a field-of-view angle γ and field-of-view axis 124. Light 109 reflects from the object 110 from a first area 126 (in a two-dimensional rendering) delineated by the overlap of the first field-of-illumination 112 and the field-of-view 122 when the object 110 is located at the first position 111. Likewise, light 117 reflects from the object 110 in an area 128 (in a two-dimensional rendering) delineated by the overlap of the second field-of-illumination 118 and the field-of-view 122 when the object 110 is located at the first position 111.

Similarly, light 109 reflects from the object 110 from another first area 127 (in a two-dimensional rendering) delineated by the overlap of the first field-of-illumination 112 and the field-of-view 122 when the object 110 is located at the second position 113. Likewise, light 117 reflects from the object 110 in another area 129 (in a two-dimensional rendering) delineated by the overlap of the second field-of-illumination 118 and the field-of-view 122 when the object 110 is located at the second position 113.

The light-sensitive assembly 106 is operable to convert light 109 emitted by the first light-emitting assembly 102 and reflected from the object 110 at the first position 111 into a first signal. Likewise, the light-sensitive assembly 106 is further operable to convert light 117 emitted by the second light-emitting assembly 104 and reflected from the object 110 at the first position 111 into a second signal.

Moreover, the light-sensitive assembly 106 is disposed from the first light-emitting assembly 102 by a first pitch 130, and the light-sensitive assembly 106 is disposed from the second light-emitting assembly 104 by a second pitch 132.

The first light-emitting assembly 102, the second light-emitting assembly 104, and the light-sensitive assembly 106 each include optical assemblies 134, 136, and 138, respectively, as depicted in FIG. 1A. Each optical assembly can include a refractive or diffractive optical element, a microlens array, an optical filter, or other optical elements. In other instances, the first light-emitting assembly 102, the second light-emitting assembly 104, and the light-sensitive assembly 106 are not implemented with optical assemblies 134, 136, and 138. Alternatively, any one of the first light-emitting assembly 102, the second light-emitting assembly 104, and the light-sensitive assembly 106 may be implemented with an optical assembly 134, 136, and 138, respectively. In some instances, for example, the light-emitting assemblies 102, 104 may not be implemented with optical assemblies 134, 136, but the light-sensitive assembly 106 may be implemented with an optical assembly 138. In some instances, any or all the optical assemblies 134, 136, 138 can include an anti-reflection coating.

The first light-emitting assembly 102 and the second light-emitting assembly 104 include first and second light-emitting components 140, 142, respectively, such as, light-emitting diodes, laser diodes, a combination of the aforementioned, or an array of the aforementioned. The first and second light-emitting components 140, 142 need not be the same. For example, in some instances the first light-emitting component 140 may be a light-emitting diode, and the second light-emitting component 142 may be a laser diode. The first light-emitting component 140 together with the optical assembly 134 can be operable to emit light 108 of a first particular wavelength (e.g., infrared light or red light) from the first light-emitting assembly 102. Likewise, the second light-emitting component 142 together with the optical assembly 136 can be operable to emit light 116 of a second particular wavelength (e.g., infrared light or red light) from the second light-emitting assembly 104.

The light-sensitive assembly 106 can include a light-sensitive component 144, such as a photodiode, a charge-coupled device, a complementary metal-oxide-semiconductor, a combination of the aforementioned, or an array of the aforementioned, sensitive to the first and second particular wavelength or range of wavelengths (e.g., infrared light or red light). The light-sensitive component 144 together with the optical assembly 138 can be operable to collect light 109 and light 117 reflected from the object 110.

The optoelectronic devices described in this disclosure are characterized by an asymmetric field overlap. The asymmetric field overlap permits proximity measurements independent of object surface reflectivity as illustrated with the example optoelectronic device 100A. An asymmetric field overlap is attained by the optoelectronic device 100A when, for example:

1.) the first and second pitches 130, 132 are substantially equal;
2.) the first field-of-illumination axis 114, second field-of-illumination axis 120, and field-of-view axis 124 are all substantially parallel;
3.) the first field-of-illumination angle α and the field-of-view angle γ are substantially equal; and
4.) the second field-of-illumination angle β is not substantially equal to either the first field-of-illumination angle α or the field-of-view angle γ.

In some instances, the first field-of-illumination angle α is between two and ten times the angle of the second field-of-illumination angle β. For example, the first field-of-illumination angle α can be 60 degrees and the second field-of-illumination angle β can be 10 degrees.

In some instances, the first field-of-illumination axis 114 and second field-of-illumination axis 120 are substantially parallel, but the field-of-view axis 124 is substantially not parallel. For example, the field-of-view axis 124 can be tilted relative to either the first field-of-illumination axis 114 or the second field-of-illumination axis 120 by between 1 degree and 45 degrees or more. Similarly, the first field-of-illumination axis 114 and second field-of-illumination axis 120 may be tilted relative to each other by between 1 degree and 45 degrees or more.

The aforementioned configurations result in the first area 126 and the second area 128 being unequal when the object 110 is located at the first position 111. Similarly, the other first area 127 and the other second area 129 are unequal when the object 110 is located at the second position 113.

Since the light-sensitive assembly 106 is operable to convert light emanating from the first area 126 and the second area 128 into first and second signals, respectively, the magnitude of each signal will be different as each signal is nominally related to the quanta of light reflected from each area. Consequently, the ratio of the two signals depends strongly on the asymmetric field overlap, and is largely independent of object surface reflectivity since the object 110 in this example exhibits invariant reflectivity across its surface.

FIG. 1A illustrates the relationship between the first and second signal ratio and the position of the object 110. The ratio of the first and second areas 126, 128 for the first position 111, and the ratio of the other first and second areas 127, 129 are different, though (as described above) invariant with respect to object surface reflectivity. Accordingly, the ratio of the first and second signals can be used to determine the position of the object 110 independent of object surface reflectivity.

The optoelectronic device 100A can include a processor 146 and non-transitory computer-readable medium. The optoelectronic device can be calibrated by associating a plurality of signal ratios with a plurality of corresponding positions. The results of the calibration can be stored in a standard look-up table contained within the non-transitory computer-readable medium and can be employed during use of the optoelectronic device 100A.

In order to collect the first and second signals with a single light-sensitive assembly 102, the first and second signals may be converted at different respective instances in time. For example, the first light-emitting assembly 102 can emit light 108 at a first instance, wherein light 126 reflected from the object 110 can be converted to the first signal, and then the second light-emitting assembly 104 can emit light 116 at a second instance, wherein light 128 reflected from the object 110 can then be converted to the second signal.

Figure 1B:
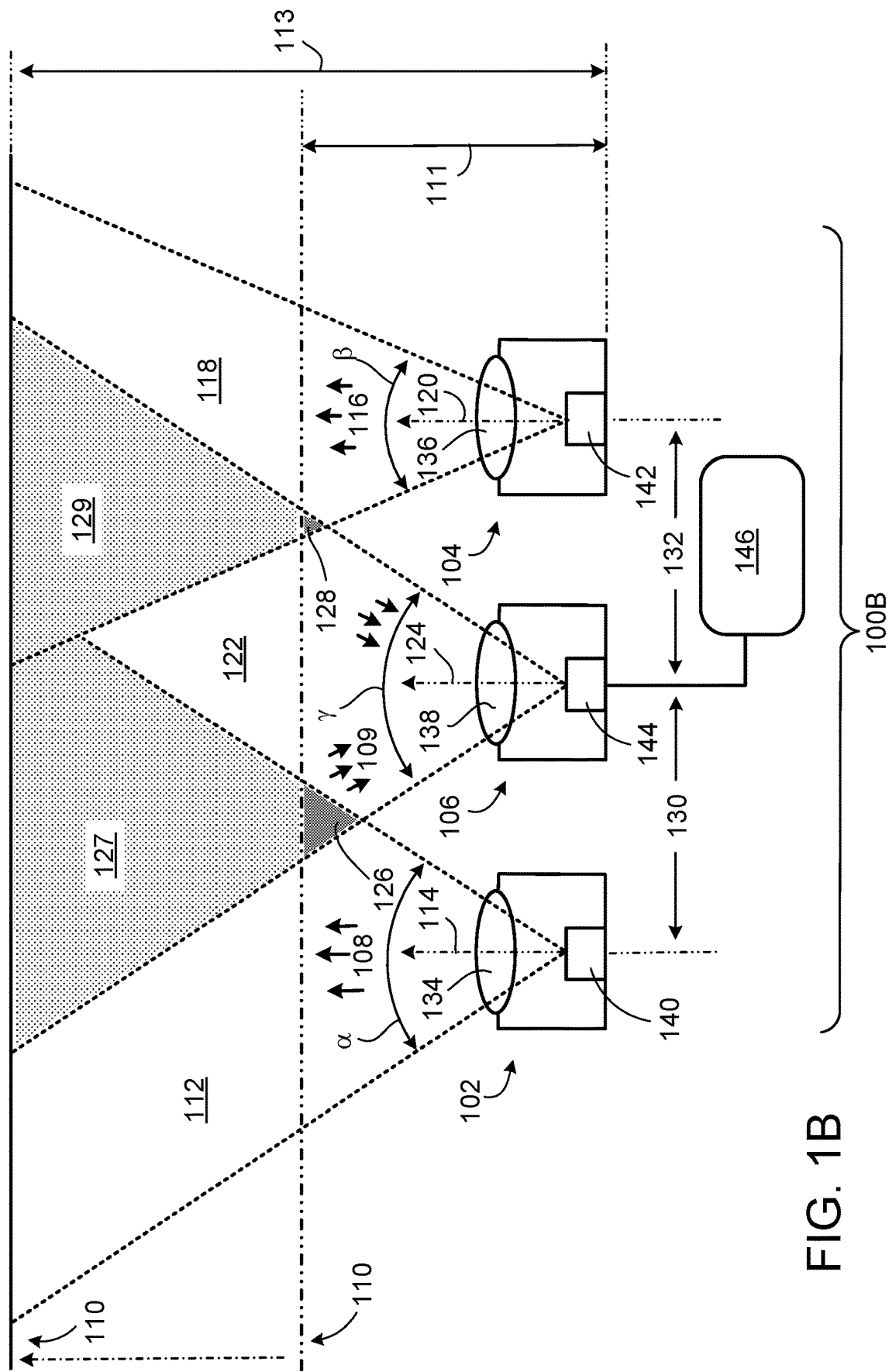
FIG. 1B depicts another example optoelectronic device having an asymmetric field overlap; the example device includes multiple light-emitting assemblies and a light-sensitive assembly.

FIG. 1B depicts another example optoelectronic device 100B operable to measure proximity independently of object surface reflectivity where all components in the optoelectronic device 100B, including component numbers, are equivalent to the components depicted in FIG. 1A with the following two exceptions: pitches 130 and 132 are not substantially equal, and the first field-of-illumination angle α second field-of-illumination angle β substantially equal. In some instances, the second pitch can be between two and six times the length of the first pitch. For example, the first pitch can be 1 mm and the second pitch can be 2 mm. Consequently, an asymmetric field overlap is generated as described in FIG. 1A, wherein ratios of the first and second signals can be used to determine the position of the object 110 independent of object surface reflectivity.

Other implementations of optoelectronic devices configured to attain an asymmetric overlap and operable to measure proximity independently of object surface reflectivity are within the scope of this disclosure. An asymmetric field overlap can be attained by any configuration including up to all but one of the following:
the first pitch is substantially equal to the second pitch
the first field-of-view angle is substantially equal to the second field-of-view angle
the first field-of-view axis is substantially parallel to the second field-of-view axis
the field-of-illumination angle is substantially equal to the first field-of-view angle
the field-of-illumination angle is substantially equal to the second field-of-view angle
the field-of-illumination axis is substantially parallel to the first field-of-view axis
the field-of-illumination axis is substantially parallel to the second field-of-view axis.

In some implementations, the first field-of-illumination angle α and the second field-of-illumination angle β are substantially unequal, and the first pitch and second pitch are substantially unequal. For example, the first field-of-illumination angle α is between two and ten times the angle of the second field-of-illumination angle β, the second pitch can be between two and six times the length of the first pitch. In some instances, the first field-of-illumination angle α can be 60 degrees, the second field-of-illumination angle β can be 10 degrees, the first pitch can be 1 mm, and the second pitch can be 2 mm.

Figure 2:
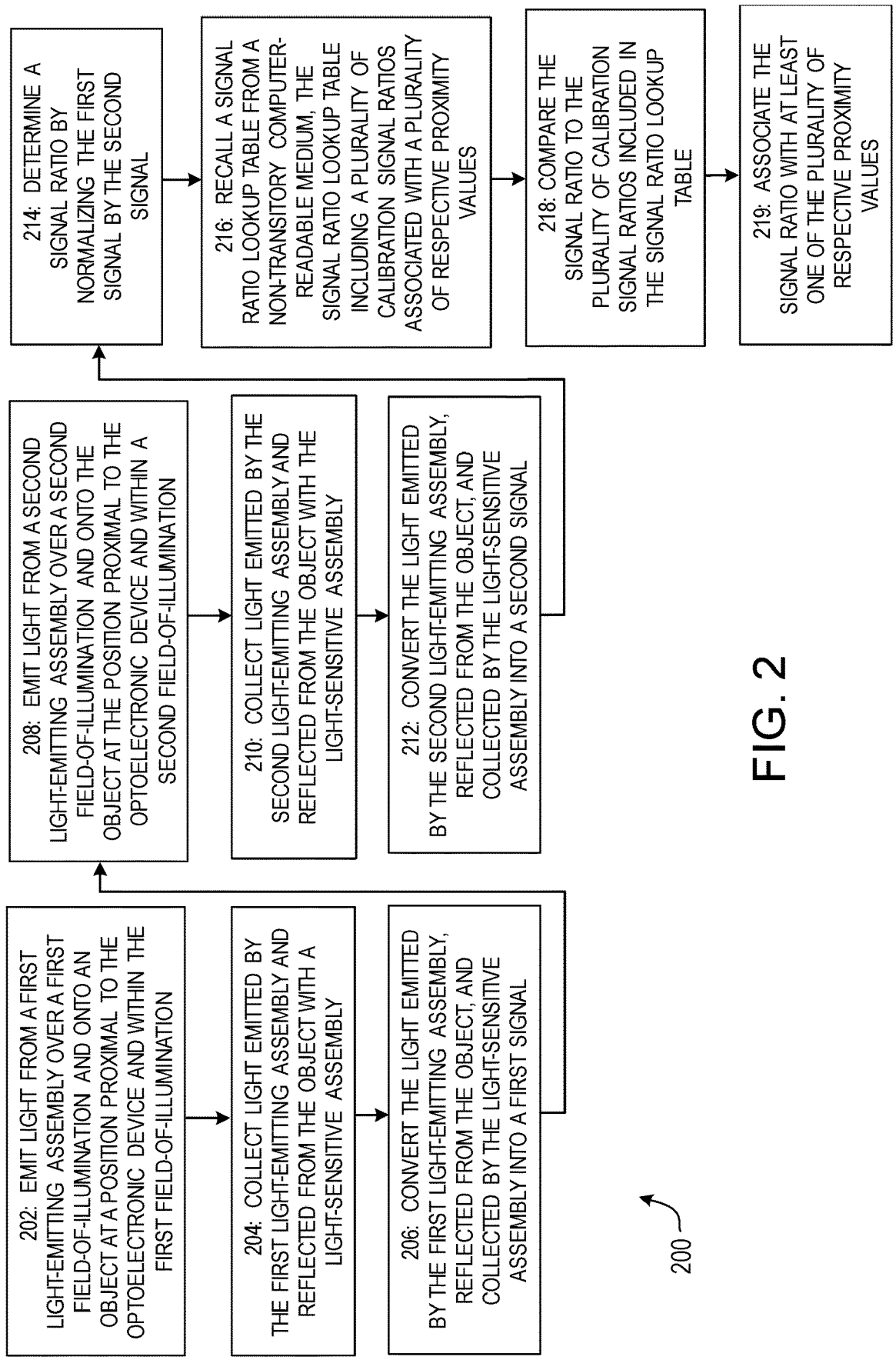
FIG. 2 depicts an example of a method for operating an optoelectronic device having an asymmetric field overlap.

FIG. 2 depicts an example method for operating an optoelectronic device characterized by an asymmetric field overlap such as the optoelectronic devices depicted in FIG. 1A and FIG. 1B. At 202, light 108 is emitted from the first light-emitting assembly 102 over a first field-of-illumination 112 and onto an object 110 at a position 111 proximal to the optoelectronic device and within the first field-of-illumination 112.

At 204, light 109 emitted by the first light-emitting assembly 102 and reflected from the object 110 is collected with a light-sensitive assembly 106. At 206, the light emitted by the first light-emitting assembly 102, reflected from the object 110, and collected by the light-sensitive assembly 140 is converted into a first signal. At 208, light 116 is emitted from the second light-emitting assembly 104 over the second field-of-illumination 118 and onto the object 110 at the position proximal to the optoelectronic device and within the second field-of-illumination 118. At 210, light 117 emitted by the second light-emitting assembly 104 and reflected from the object 110 is collected with the light-sensitive assembly 106. At 212, the light 117 emitted by the second light-emitting assembly 104, reflected from the object 110, and collected by the light-sensitive assembly 106 is converted into a second signal.

At 214, a signal ratio is determined by normalizing the first signal by the second signal. At 216, a signal ratio lookup table is recalled from a non-transitory computer-readable medium. The signal ratio lookup table includes a plurality of calibration signal ratios associated with a plurality of respective proximity values. At 218, the signal ratio is compared to the plurality of calibration signal ratios included in the signal ratio lookup table. At 220, the signal ratio is associated with at least one of the plurality of respective proximity values.

Figure 3A:
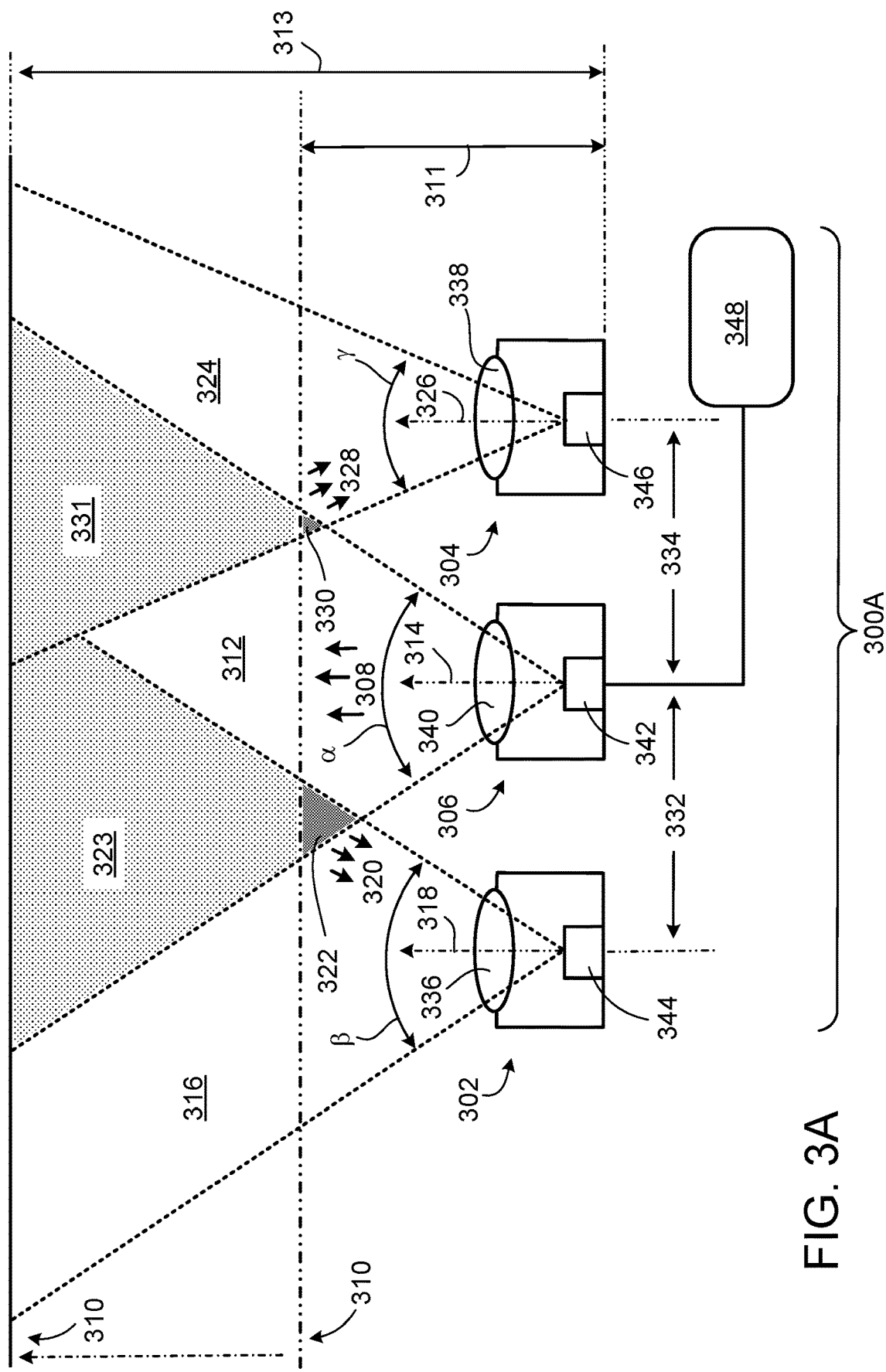
FIG. 3A depicts an example of an optoelectronic device having an asymmetric field overlap; the example device includes a light-emitting assembly and multiple light-sensitive assemblies.

FIG. 3A depicts an example optoelectronic device 300A operable to measure proximity independently of object surface reflectivity. The optoelectronic device 300A includes a first light-sensitive assembly 302, a second light-sensitive assembly 304, and a light-emitting assembly 306. The light-emitting assembly 306 is operable to emit light 308 onto an object 310 at a position proximal to the optoelectronic device 300A, such as first and second positions 311, 313, respectively, within a field-of-illumination 312. The field-of-illumination 312 is characterized by a field-of-illumination angle α and field-of-illumination axis 314.

The first light-sensitive assembly 302 is operable to collect light over a first field-of-view 316. The first field-of-view 316 is characterized by a first field-of-view angle β and first field-of-view axis 318. Light 320 reflects from the object 310 from a first area 322 (in a two-dimensional rendering) delineated by the overlap of the field-of-illumination 312 and the first field-of-view 316 when the object 310 is located at the first position 311. Likewise, the second light-sensitive assembly 304 is operable to collect light over a second field-of-view 324. The second field-of-view 324 is characterized by a second field-of-view angle γ and a second field-of-view axis 326. Light 328 reflects from the object 310 from a second area 330 (in a two-dimensional rendering) delineated by the overlap of the field-of-illumination 312 and the second field-of-view 324 when the object 310 is located at the first position 311.

Similarly, light 320 reflects from the object 310 from another first area 323 (in a two-dimensional rendering) delineated by the overlap of the field-of-illumination 312 and the first field-of-view 316 when the object 310 is located at the second position 313. Likewise, light 328 reflects from the object 310 from a second area 331 (in a two-dimensional rendering) delineated by the overlap of the field-of-illumination 312 and the second field-of-view 324 when the object 310 is located at the second position 313.

The first light-sensitive assembly 302 is operable to convert light 320 emitted by the light-emitting assembly 306 and reflected from the object 310 at the first position 311 into a first signal. Likewise, the second light-sensitive assembly 304 is operable to convert light 328 emitted by the light-emitting assembly 302 and reflected from the object 310 at the first position 311 into a second signal.

Figure 5A:
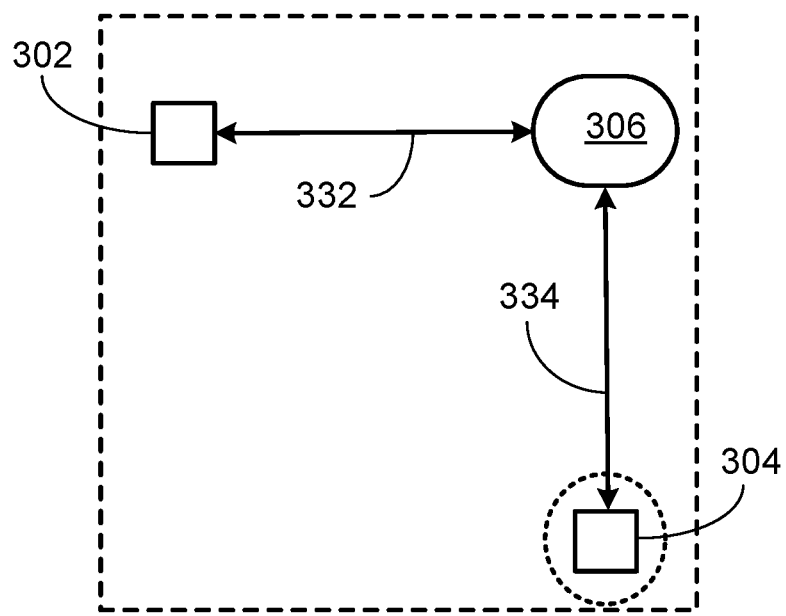
FIG. 5A illustrates a plan view in which light-sensitive assemblies are equally spaced from the light-emitting assembly.
Figure 5B:
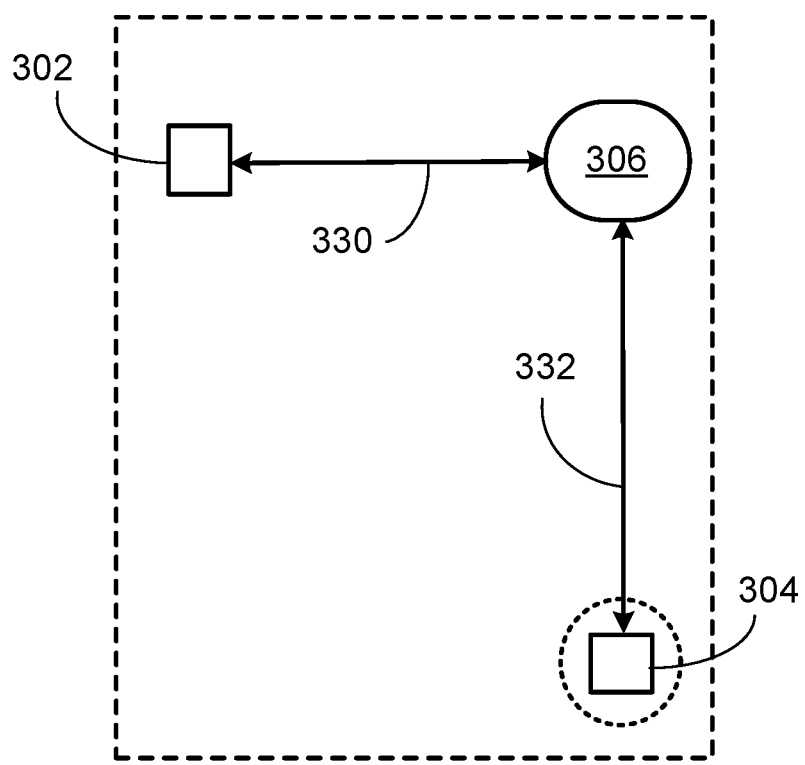
FIG. 5B illustrates a plan view in which light-sensitive assemblies are unequally spaced from the light-emitting assembly.

Moreover, the first light-sensitive assembly 302 is disposed from the light-emitting assembly 306 by a first pitch 332, and the second light-sensitive assembly 304 is disposed from the light-emitting assembly 306 by a second pitch 334. As illustrated in FIG. 3A, in some instances, the two light-sensitive assemblies 302, 304 are equidistant from the light-emitting assembly 306 (i.e., the pitches 332, 334 are equal). See also FIG. 5A. In other instances, as discussed below in connection with FIG. 3B, and as illustrated in FIG.

5B, the two light-sensitive assemblies 302, 304 are not equally spaced from the light-emitting assembly 306 (i.e., the pitches are unequal).

Each of the light-emitting assembly 306, the first light-sensitive assembly 302, and the second light-sensitive assembly 304 can include optical assemblies 336, 338, and 340, respectively, as depicted in FIG. 3A. Each optical assembly can include a refractive or diffractive optical element, a microlens array, an optical filter, or other optical elements. In other instances, the light-emitting assembly 306, the first light-sensitive assembly 302, and the second light-sensitive assembly 304 are not implemented with optical assemblies 336, 338, and 340. Alternatively, any one of the light-emitting assembly 306, the first light-sensitive assembly 302, and the second light-sensitive assembly 304 may be implemented with an optical assembly 336, 338, and 340, respectively. In some instances, for example, the light-emitting assembly 306 may not be implemented with an optical assembly 336, but the light-sensitive assemblies 302, 304 may be implemented with optical assemblies 338, 340. In some instances, any or all the optical assemblies 336, 338, 340 can include an anti-reflection coating.

The light-emitting assembly 306 includes a light-emitting component 342, such as, light-emitting diodes, laser diodes, a combination of the aforementioned, or an array of the aforementioned. The light-emitting component 342 together with the optical assembly 340 can be operable to emit light 308 of a particular wavelength (e.g., infrared light or red light) from the light-emitting assembly 306.

The first light-sensitive assembly 302 and the second light-sensitive assembly 304 include first and second light-sensitive components 344, 346, respectively, such as photodiodes, charge-coupled devices, complementary metal-oxide-semiconductors, combinations of the aforementioned, or arrays of the aforementioned, sensitive to the particular wavelength or range of wavelengths (e.g., infrared light or red light). The first and second light-sensitive components 344. 346 need not be the same. For example, in some instances the first light-sensitive component 344 may be a photodiode, and the second light-sensitive component 346 may be a charge-coupled device. The first light-sensitive component 344 together with the optical assembly 336 can be operable to collect light 320 reflected from the object 310. Likewise, the second light-sensitive component 346 together with the optical assembly 338 can be operable to collect light 328.

As described above, the optoelectronic devices described in this disclosure have an asymmetric field overlap. The asymmetric field overlap permits proximity measurements independent of object surface reflectivity as further illustrated with the example optoelectronic device 300A. An asymmetric field overlap is attained by the optoelectronic device 300A when, for example:

1.) the first and second pitches 332, 334 are substantially equal;
2.) the first field-of-view axis 318, second field-of-view axis 326, and field-of-illumination axis 314 are all substantially parallel;
3.) the first field-of-view angle β and the field-of-illumination angle α are substantially equal; and
4.) the second field-of-view angle γ is not substantially equal to either the first field-of-view angle β or the field-of-illumination angle α.

In some instances, the first field-of-view angle β is between two and ten times the angle of the second field-of-view angle γ. For example, the first field-of-view angle β can be 60 degrees and the second field-of-illumination angle γ can be 10 degrees.

In some instances, the first field-of-view axis 318 and second field-of-view axis 326 are substantially parallel, but the field-of-illumination axis 314 is substantially not parallel. For example, the field-of-illumination axis 314 can be tilted relative to either the first field-of-view axis 318 or the second field-of-view axis 326 by between 1 degree and 45 degrees or more. Similarly, the first field-of-view axis 318 and second field-of-view axis 326 may be tilted relative to each other by between 1 degree and 45 degrees or more.

The aforementioned configurations result in the first area 322 and the second area 330 being unequal when the object 310 is located at the first position 311. Similarly, the other first area 323 and the other second area 331 are unequal when the object 310 is located at the second position 313.

Since the first light-sensitive assembly 302 is operable to convert light 320 emanating from the first area 322 into the first signal, and the second light-sensitive assembly 304 is operable to convert light 328 emanating from the second area 330 into the second signal, the magnitude of each signal will be different as each signal is nominally related to the quanta of light reflected from each area. Consequently, the ratio of the two signals depends strongly on the asymmetric field overlap, and is largely independent of object surface reflectivity since the object 310 in this example exhibits invariant reflectivity across its surface.

FIG. 3A illustrates the relationship between the first and second signal ratio and the position of the object 310. The ratio of the first and second areas 322, 330 for the first position 311, and the ratio of the other first and second areas 323, 331 are different, though (as described above) invariant with respect to object surface reflectivity. Accordingly, the ratio of the first and second signals can be used to determine the position of the object 310 independent of object surface reflectivity.

The optoelectronic device 300A can include a processor 348 and non-transitory computer-readable medium. The optoelectronic device 300A can be calibrated by associating a plurality of signal ratios with a plurality of corresponding positions. The results of the calibration can be stored in a standard look-up table contained within the non-transitory computer-readable medium and can be employed during use of the optoelectronic device 300A.

Figure 3B:
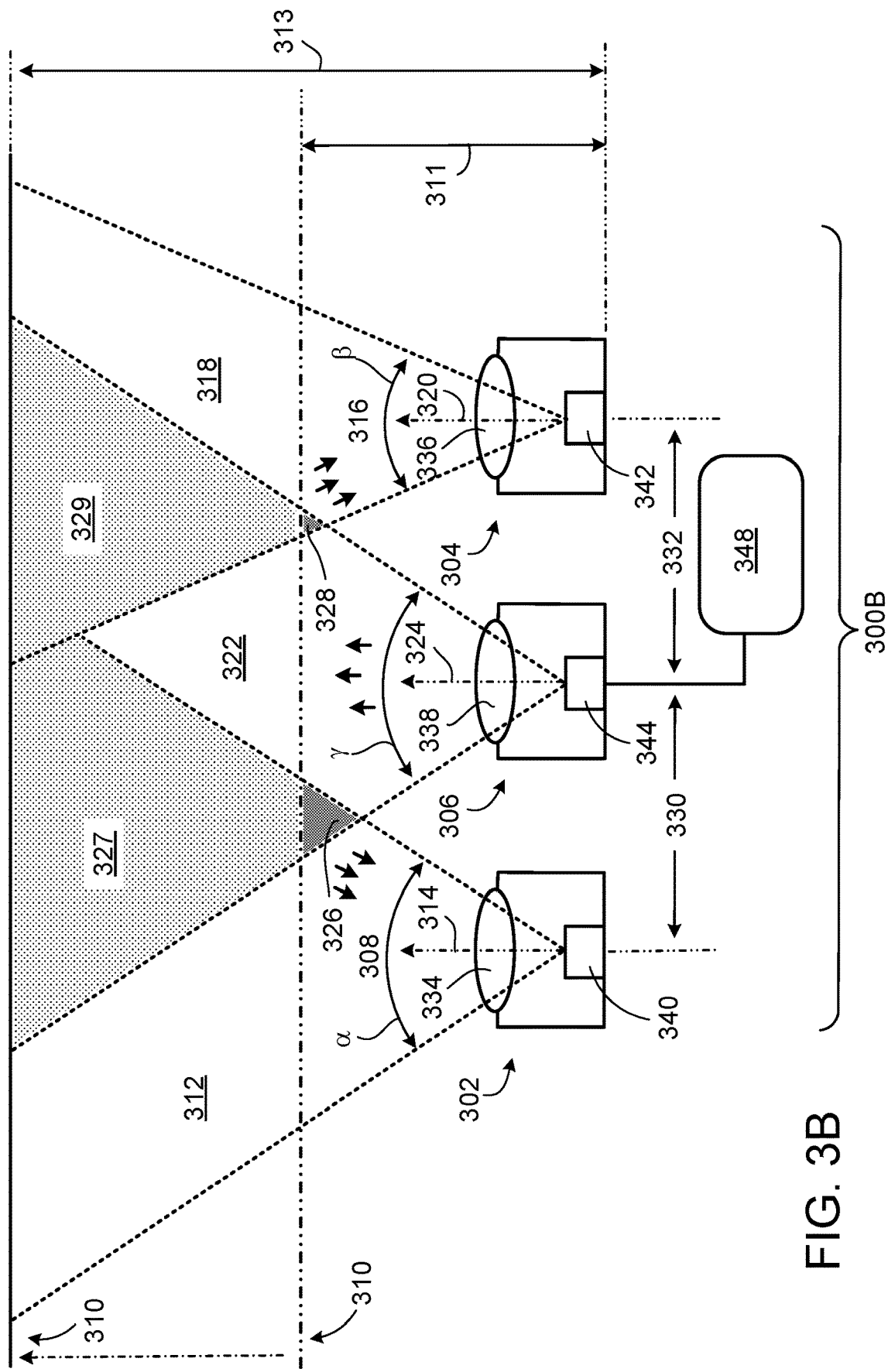
FIG. 3B depicts another example of an optoelectronic device having an asymmetric field overlap; the example device includes a light-emitting assembly and multiple light-sensitive assemblies.

FIG. 3B depicts another example optoelectronic device 300B operable to measure proximity independently of object surface reflectivity. In FIG. 3B, all components in the optoelectronic device 300B, including component numbers, are equivalent to the components depicted in FIG. 3A with the following two exceptions: the pitches 332 and 330 are not substantially equal (i.e., the two light-sensitive assemblies 302, 304 are not equally spaced from the light-emitting assembly 306), and the second field-of-view angle γ and field-of-illumination angle α are substantially equal. In some instances, the second pitch can be between two and six times the length of the first pitch. For example, the first pitch can be 1 mm and the second pitch can be 2 mm. Consequently, an asymmetric field overlap is generated as described in FIG. 3A, wherein ratios of the first and second signals can be used to determine the position of the object 310 independent of object surface reflectivity.

Other implementations of optoelectronic devices configured to attain an asymmetric overlap and operable to measure proximity independently of object surface reflectivity are within the scope of this disclosure. An asymmetric field overlap can be attained by a configuration including up to all but one of the following:

- the first pitch is substantially equal to the second pitch
- the first field-of-view angle is substantially equal to the second field-of-view angle
- the first field-of-view axis is substantially parallel to the second field-of-view axis
- the field-of-illumination angle is substantially equal to the first field-of-view angle
- the field-of-illumination angle is substantially equal to the second field-of-view angle
- the field-of-illumination axis is substantially parallel to the first field-of-view axis
- the field-of-illumination axis is substantially parallel to the second field-of-view axis.

In some implementations, the first field-of-view angle $\beta$ and the second field-of-view angle $\gamma$ are substantially unequal, and the first pitch and second pitch are substantially unequal. For example, the first field-of-view angle $\beta$ is between two and ten times the angle of the second field-of-view angle $\gamma$, the second pitch can be between two and six times the length of the first pitch. In some instances, the first field-of-view angle $\beta$ can be 60 degrees, the second field-of-view angle $\gamma$ can be 10 degrees, the first pitch can be 1 mm, and the second pitch can be 2 mm.

FIG. 4 depicts another example method for operating an optoelectronic device characterized by an asymmetric field overlap, such as the example optoelectronic devices depicted in FIG. 3A and FIG. 3B. At 402, light is emitted from a light-emitting assembly over a field-of-illumination and onto an object at a position proximal to the optoelectronic device and within the field-of-illumination.

At 404, light emitted by the light-emitting assembly and reflected from the object is collected with a first light-sensitive assembly. At 406, light emitted by the light-emitting assembly, reflected from the object, and collected by the first light-sensitive assembly is converted into a first signal.

At 408, light emitted by the light-emitting assembly and reflected from the object is collected with a second light-sensitive assembly. At 410, the light emitted by the light-emitting assembly, reflected from the object, and collected by the second light-sensitive assembly is converted into a second signal.

At 412, a signal ratio is determined by normalizing the first signal by the second signal. At 414, a signal ratio lookup table is recalled from a non-transitory computer-readable medium. The signal ratio lookup table includes a plurality of calibration signal ratios associated with a plurality of respective proximity values. At 416, the signal ratio is compared to the plurality of calibration signal ratios included in the signal ratio lookup table. At 418, the signal ratio is associated with at least one of the plurality of respective proximity values.

Figure 6:
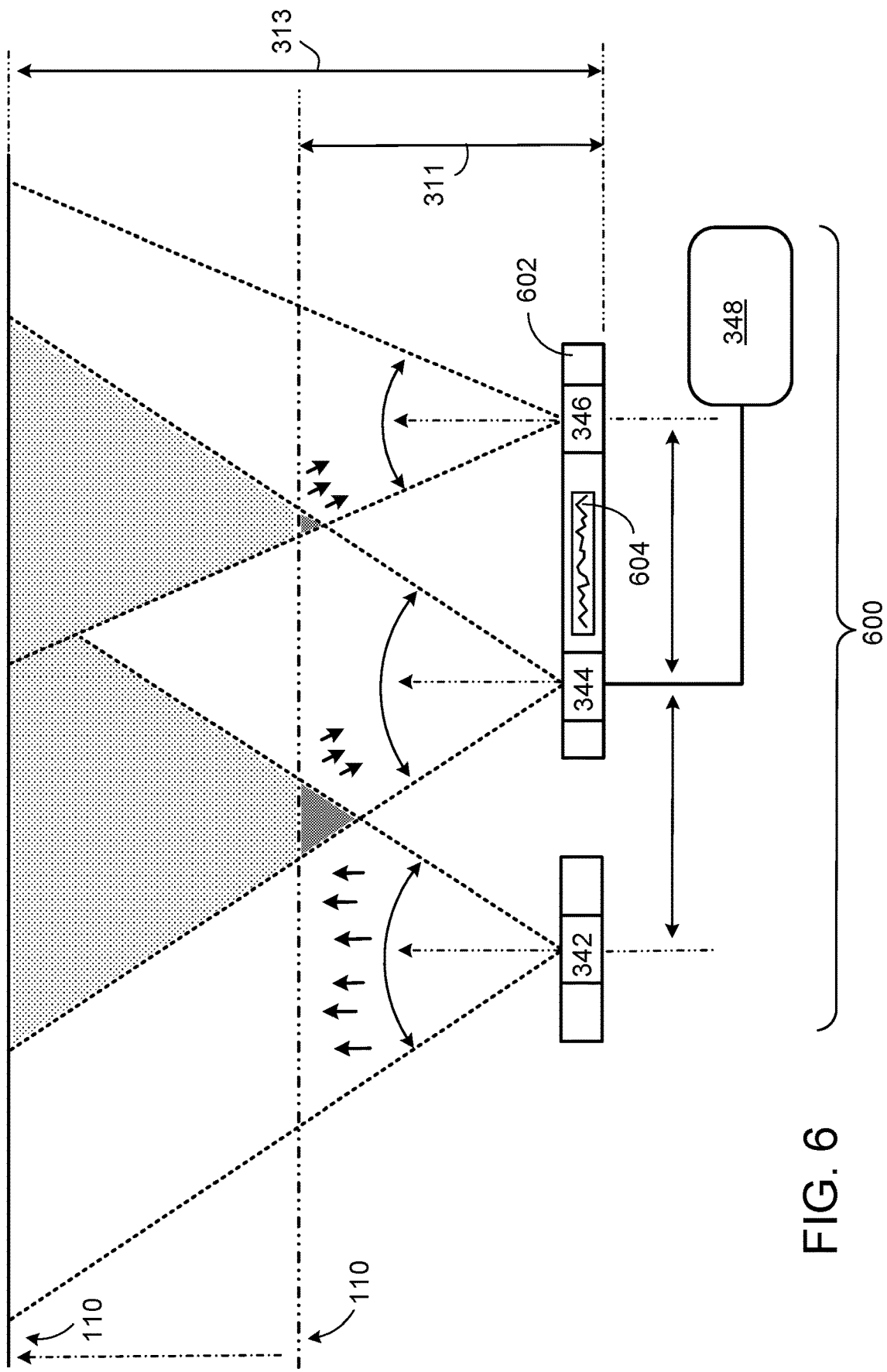
FIG. 6 illustrates an example of an optoelectronic device in which light-sensitive components for the light-sensitive assemblies are implemented in a single semiconductor chip.

Implementations, such as those described above, in which the optoelectronic device includes multiple light-sensitive assemblies and a light-emitting assembly, can provide various advantages in some instances. Advantages can include, for example, lower power consumption. Further, in some instances, the light-sensitive components 344, 346 for the light-sensitive assemblies can be implemented in the same semiconductor (e.g., silicon) chip 602, as shown in the example of FIG. 6. In such instances, the space within the chip between the two light-sensitive components 344, 346 can be used for logic and circuitry 604, which can result in a smaller overall footprint for the optoelectronic device 600. Further, some implementations that include multiple light-sensitive assemblies and a light-emitting assembly can be used to determine actual distance/proximity in addition to relative distance/proximity.

Figure 7:
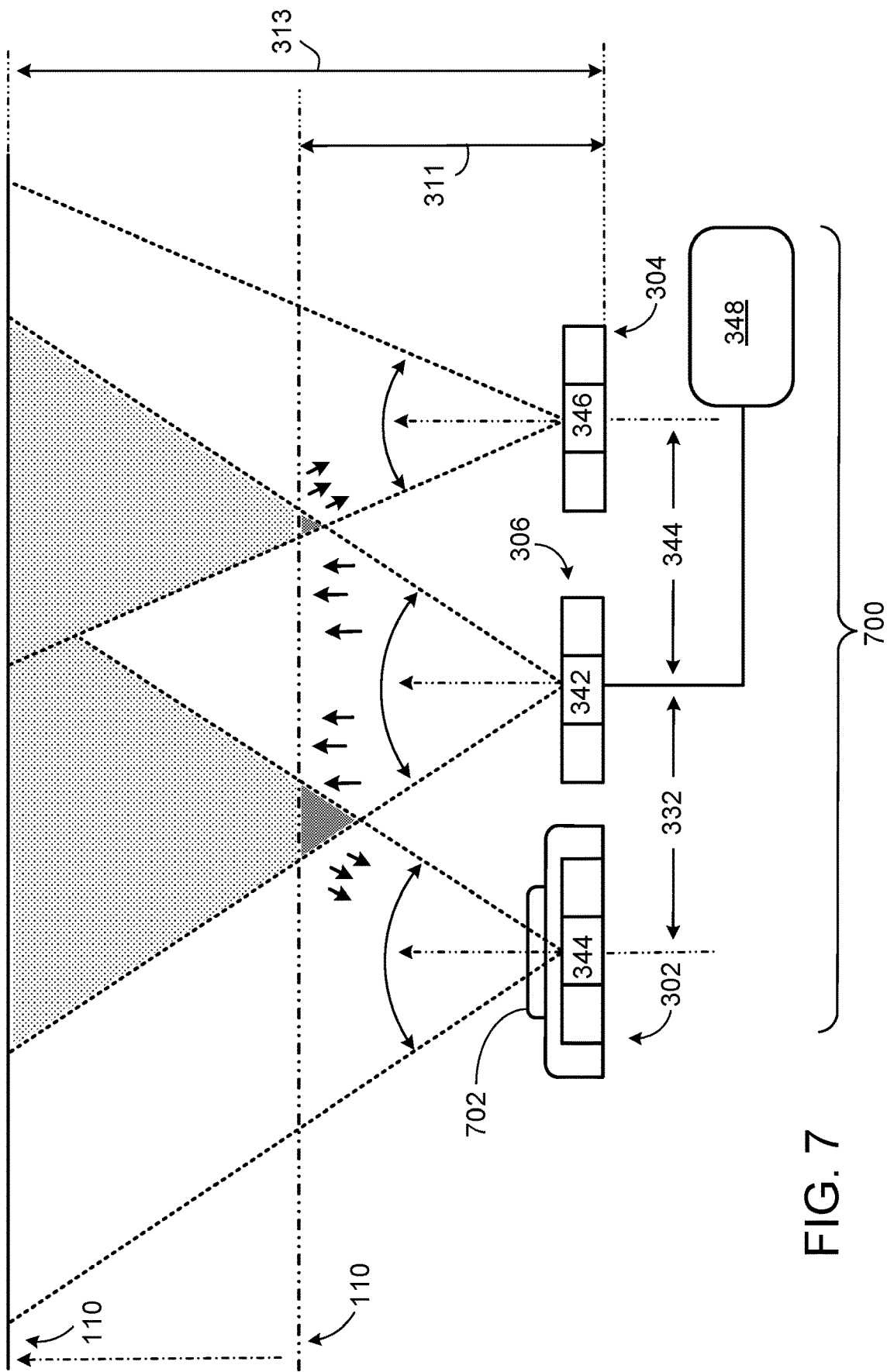
FIG. 7 illustrates an example in which multiple approaches for generating an asymmetric field overlap are combined.

Although the light-emitting assemblies and light-sensitive assemblies in some of the illustrated implementations have associated optical elements (e.g., lenses), in some instances, the optical elements can be omitted. Nevertheless, in some cases, optical elements such as lenses can be used to generate the asymmetric field overlap. In such instances, a difference is provided between the channels. For example, where two light-sensitive assemblies are implemented (e.g., FIG. 3A or 3B), one receiving channel can include a lens, whereas the other receiving channel does not. For example, as shown in FIG. 7, the two light-sensitive assemblies 302, 304 are equidistant from the light-emitting component 342 of the light emitting assembly 306, but only one of the light-sensitive assemblies (e.g., 302) includes an optical element (e.g., a lens) 702 to generate the asymmetric field overlap. Alternatively, both receiving channels can include a respective optical element (e.g., a lens) that differs from the optical element (e.g., lens) in the other receiving channel. When lenses are present, the lenses can be mounted relative to the light-sensitive assemblies, for example, via a housing or the lenses can be molded directly onto of a component of the light-sensitive assembly (e.g., molded directly on top of a photodiode).

In general, two or more approaches described above for attaining an asymmetric overlap can be used in combination. Thus, a difference in pitch for the light-sensitive assemblies can be combined with use of an optical element (e.g., lens) in only one of the light receiving channels (or use of different respective optical elements for the light receiving channels) to achieve the asymmetric overlap. An example in shown in FIG. 7, in which the two light-sensitive assemblies 302, 304 are not equally spaced from the light-emitting component 342 of the light-emitting assembly 306 (i.e., the pitches are unequal). The unequal spacing causes an asymmetric overlap, but in an effort to save space, the unequal spacing, in some cases, may be not be enough to generate a sufficient asymmetric overlap. Thus, a lens 702 is included over the light-sensitive component 344 of one of the light-sensitive assemblies 302, which contributes to, and enhances, the asymmetric overlap. Other approaches, such as the field-of-illumination or field-of-view axes differences, also can be combined to achieve a particular amount of asymmetric overlap.

Some implementations include a plurality of light-emitting assemblies and a plurality of light-sensitive assemblies.

In some instances, the methods described above can include activating an auxiliary function, the auxiliary function being implemented on a host device (e.g., smartphone, tablet computer, or laptop computer) into which the optoelectronic device is incorporated.

In some instances, the auxiliary function includes activating a display screen incorporated into the host device. For example, in instances where the optoelectronic device is incorporated into a smartphone, a user can activate the display screen by positioning a finger in close proximity to or in contact with the optoelectronic device.

In some instances, the auxiliary function includes regulating power to a component incorporated into the host device. For example, a user can vary power to a display screen by positioning a finger at varying positions relative to the optoelectronic. In another example, a user can vary power to a light source by positioning a finger at varying positions relative to the optoelectronic device.

In some instances, the position of the object proximal to the optoelectronic device is collected over time and stored in the non-transitory computer-readable medium as three-dimensional data. For example, data detailing the position of the object as a function of time can be used to interpret gestures. For instance, a user may thrust a finger or hand in close proximity to the optoelectronic device. Consequently, the three-dimensional data can include velocity and/or acceleration data of the object.

Various modifications may be made to the foregoing implementations. Features described above in different implementations may be combined in the same implementations. Thus, other implementations are within the scope of the claims.

What is claimed is:

1. An optoelectronic device having an asymmetric field overlap and operable to measure proximity independently of object surface reflectivity, the device comprising:
   a first light-emitting assembly operable to emit light onto an object at a position proximal to the optoelectronic device within a first field-of-illumination, the first field-of-illumination having a first field-of-illumination angle and first field-of-illumination axis;
   a second light-emitting assembly operable to emit light onto the object at the position proximal to the optoelectronic device and within a second field-of-illumination, the second field-of-illumination having a second field-of-illumination angle and a second filed-of-illumination axis; and
   a light-sensitive assembly operable to collect light over a field-of-view, the field-of-view having a field-of-view angle and field-of-view axis;
   the light-sensitive assembly operable to convert light emitted by the first light-emitting assembly reflected from the object from a first area into a first signal, and the light-sensitive assembly operable to convert light emitted by the second light-emitting assembly reflected from the object from a second area into a second signal;
   the light-sensitive assembly being disposed from the first light-emitting assembly at a first pitch, and the light-sensitive assembly being disposed from the second light-emitting assembly at a second pitch such that the first area and the second area are unequal.

2. The optoelectronic device of claim 1, wherein the first light-emitting assembly, the second light-emitting assembly, and/or the light-sensitive assembly includes an optical assembly, or
   wherein the first light-emitting assembly and the second light-emitting assembly includes a light-emitting component wherein the light-emitting component optionally includes a light-emitting diode and/or a laser diode, or
   wherein the light-sensitive assembly includes a light-sensitive component and wherein the light-sensitive component optionally includes a photodiode, charge-coupled device, and/or a complementary metal-oxide-semiconductor; and
   wherein the optical assembly optionally includes an anti-reflection coating.

3. The optoelectronic device of claim 1, wherein the first pitch is unequal to the second pitch, and the first field-of-illumination angle is unequal to the second field-of-illumination angle.

4. The optoelectronic device of claim 1, wherein an asymmetric field overlap is attained by any configuration including up to all but one of the following:
   the first pitch is substantially equal to the second pitch;
   the first field-of-illumination angle is substantially equal to the second illumination angle;
   the first field-of-illumination axis is substantially parallel to the second field-of-illumination axis;
   the field-of-view angle is substantially equal to the first field-of-illumination angle;
   the field-of-view angle is substantially equal to the second field-of-illumination angle;
   the field-of-view axis is substantially parallel to the first field-of-illumination axis; and
   the field-of-view axis is substantially parallel to the second field-of-illumination axis.

5. The optoelectronic device as in claim 3, wherein the second pitch is between two and ten times a length of the first pitch, and the first field-of-illumination angle is between two and ten times the second field-of-illumination angle.

6. The optoelectronic device as in claim 3, further comprising a processor communicatively coupled to the light-sensitive assembly,
   the device optionally further comprising a non-transitory computer-readable medium comprising instructions stored thereon, that when executed on the processor, perform operations including:
   emitting light from the first light-emitting assembly over the first field-of-illumination and onto the object at the position proximal to the optoelectronic device and within the first field-of-illumination;
   collecting light emitted by the first light-emitting assembly and reflected from the object over the field-of-view with the light-sensitive assembly;
   converting the light emitted by the first light-emitting assembly, reflected from the object, and collected by the light-sensitive assembly into the first signal;
   emitting light from the second light-emitting assembly over the second field-of-illumination and onto the object at the position proximal to the optoelectronic device and within the second field-of-illumination;
   collecting light emitted by the second light-emitting assembly and reflected from the object over the field-of-view with the light-sensitive assembly;
   converting the light emitted by the second light-emitting assembly, reflected from the object, and collected by the light-sensitive assembly into the second signal;
   determining a signal ratio by normalizing the first signal by the second signal;
   recalling a signal ratio lookup table from a non-transitory computer-readable medium, the signal ratio lookup table including a plurality of calibration signal ratios associated with a plurality of respective proximity values;
   comparing the signal ratio to the plurality of calibration signal ratios included in the signal ratio lookup table; and
   associating the signal ratio with at least one of the plurality of respective proximity values.

7. A method for operating an optoelectronic device having an asymmetric field overlap and operable to measure proximity independently of object surface reflectivity, the method comprising:
   emitting light from a first light-emitting assembly over a first field-of-illumination and onto an object at a position proximal to the optoelectronic device and within the first field-of-illumination;
   collecting light emitted by the first light-emitting assembly and reflected from the object from a first area with a light-sensitive assembly;

converting the light emitted by the first light-emitting assembly, reflected from the object from the first area, and collected by the light-sensitive assembly into a first signal;
emitting light from a second light-emitting assembly over a second field-of-illumination and onto the object at the position proximal to the optoelectronic device and within a second field-of-illumination;
collecting light emitted by the second light-emitting assembly and reflected from the object from a second area with the light-sensitive assembly;
converting the light emitted by the second light-emitting assembly, reflected from the object from the second area, and collected by the light-sensitive assembly into a second signal;
determining a signal ratio by normalizing the first signal by the second signal;
recalling a signal ratio lookup table from a non-transitory computer-readable medium, the signal ratio lookup table including a plurality of calibration signal ratios associated with a plurality of respective proximity values;
comparing the signal ratio to the plurality of calibration signal ratios included in the signal ratio lookup table; and
associating the signal ratio with at least one of the plurality of respective proximity values,
wherein the first light-emitting assembly, the light-sensitive assembly, and the second light-emitting assembly are configured such that the first area and the second area are unequal.

8. An optoelectronic device having an asymmetric field overlap and operable to measure proximity independently of object surface reflectivity, the device comprising:
a light-emitting assembly operable to emit light onto an object at a position proximal to the optoelectronic device within a field-of-illumination, the field-of-illumination being characterized by a field-of-illumination angle and an illumination axis;
a first light-sensitive assembly operable to collect light over a first field-of-view, the first field-of-view having a first field-of-view angle and first view axis;
the first light-sensitive assembly being operable to convert light emitted by the light-emitting assembly reflected from the object from a first area into a first signal;
a second light-sensitive assembly operable to collect light over a second field-of-view, the second field-of-view being having a second field-of-view angle and second view axis; and
the second light-sensitive assembly being operable to convert light emitted by the light-emitting assembly reflected from the object from a second area into a second signal; and
the first light-sensitive assembly being disposed from the light-emitting assembly by a first pitch, and the second light-sensitive assembly being disposed from the light-emitting assembly by a second pitch such that the first area and the second area are unequal.

9. The optoelectronic device of claim 8, wherein the light-emitting assembly, the first light-sensitive assembly, and/or the second light-sensitive assembly includes an optical assembly, and
wherein the optical assembly optionally includes an anti-reflection coating.

10. The optoelectronic device of claim 8, wherein the light-emitting assembly includes a light-emitting component, and wherein the light-emitting component optionally includes a light-emitting diode and/or a laser diode.

11. The optoelectronic device of claim 8, wherein the first light-sensitive assembly and the second light-sensitive assembly includes a light-sensitive component, and
wherein the light-sensitive component optionally includes a photodiode, a charge-coupled device, and/or a complementary metal-oxide-semiconductor.

12. The optoelectronic device as in claim 8, wherein the first pitch is unequal to the second pitch, and the first field-of-view angle is unequal to the second field-of-view angle.

13. The optoelectronic device as in claim 8, wherein the asymmetric field overlap is attained by any configuration including up to all but one of the following:
the first pitch is substantially equal to the second pitch;
the first field-of-view angle is substantially equal to the second field-of-view angle;
the first field-of-view axis is substantially parallel to the second field-of-view axis;
the field-of-illumination angle is substantially equal to the first field-of-view angle;
the field-of-illumination angle is substantially equal to the second field-of-view angle;
a field-of-illumination axis is substantially parallel to the first field-of-view axis; and
the field-of-illumination axis is substantially parallel to the second field-of-view axis.

14. The optoelectronic device as in claim 12, wherein the second pitch is between two and ten times a length of the first pitch, and the first field-of-view angle is between two and ten times the second field-of-view angle.

15. The optoelectronic device as in claim 12, wherein the first pitch is unequal to the second pitch, or
wherein the first light-sensitive assembly and the second light-sensitive assembly are implemented in a same semiconductor chip.

16. The optoelectronic device as in claim 12, including an optical element over only one of the first light-sensitive assembly or the second light-sensitive assembly, wherein a presence of the optical element contributes to the asymmetric field overlap.

17. The optoelectronic device as in claim 12, including a respective optical element over each of the first light-sensitive assembly and the second light-sensitive assembly, wherein a difference in the optical element over the first light-sensitive assembly and the optical element over the second light-sensitive assembly contributes to the asymmetric field overlap.

18. The optoelectronic device as in claim 12, further comprising a processor communicatively coupled to the first light-sensitive assembly and second light-sensitive assembly, and
the device optionally further comprising a non-transitory computer-readable medium comprising instructions stored thereon, that when executed on the processor, perform operations including:
emitting light from the light-emitting assembly over the field-of-illumination and onto the object at the position proximal to the optoelectronic device and within the field-of-illumination;
collecting light emitted by the light-emitting assembly and reflected from the object from the first area with the first light-sensitive assembly;

converting the light emitted by the light-emitting assembly, reflected from the object from the first area, and collected by the first light-sensitive assembly into the first signal;

collecting light emitted by the light-emitting assembly and reflected from the object from the second area with the second light-sensitive assembly;

converting the light emitted by the light-emitting assembly, reflected from the object from the second area, and collected by the second light-sensitive assembly into the second signal;

determining a signal ratio by normalizing the first signal by the second signal;

recalling a signal ratio lookup table from a non-transitory computer-readable medium, the signal ratio lookup table including a plurality of calibration signal ratios associated with a plurality of respective proximity values;

comparing the signal ratio to the plurality of calibration signal ratios included in the signal ratio lookup table; and associating the signal ratio with at least one of the plurality of respective proximity values, wherein the light-emitting assembly, the first light-sensitive assembly, and the second light-sensitive assembly are configured such that the first area and the second area are unequal.

19. A method for operating an optoelectronic device having an asymmetric field overlap and operable to measure proximity independently of object surface reflectivity, the method comprising:

emitting light from a light-emitting assembly over a field-of-illumination and onto an object at a position proximal to the optoelectronic device and within the field-of-illumination;

collecting light emitted by the light-emitting assembly and reflected from the object from a first area with a first light-sensitive assembly;

converting the light emitted by the light-emitting assembly, reflected from the object from the first area, and collected by the first light-sensitive assembly into a first signal;

collecting light emitted by the light-emitting assembly and reflected from the object from a second area with a second light-sensitive assembly;

converting the light emitted by the light-emitting assembly, reflected from the object from the second area, and collected by the second light-sensitive assembly into a second signal;

determining a signal ratio by normalizing the first signal by the second signal;

recalling a signal ratio lookup table from a non-transitory computer-readable medium, the signal ratio lookup table including a plurality of calibration signal ratios associated with a plurality of respective proximity values;

comparing the signal ratio to the plurality of calibration signal ratios included in the signal ratio lookup table; and associating the signal ratio with at least one of the plurality of respective proximity values, wherein the light-emitting assembly, the first light-sensitive assembly, and the second light-sensitive assembly are configured such that the first area and the second area are unequal.

20. The method of claim 19, further comprising activating an auxiliary function, the auxiliary function being implemented on a host device into which the optoelectronic device is incorporated, and wherein the auxiliary function optionally includes activating a display screen incorporated into the host device, or wherein the auxiliary function optionally includes regulating power to a component incorporated into the host device, or wherein the position of the object proximal to the optoelectronic device is optionally collected over time and stored in the non-transitory computer-readable medium as three-dimensional data, and wherein the three-dimensional data optionally includes velocity and/or acceleration data of the object.

* * * * *